United States Patent
Li et al.

(10) Patent No.: US 7,808,791 B2
(45) Date of Patent: Oct. 5, 2010

(54) FASTENER AND HEAT SINK ASSEMBLY HAVING THE SAME

(75) Inventors: Min Li, Shenzhen (CN); Lei Cao, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 37 days.

(21) Appl. No.: 12/409,515

(22) Filed: Mar. 24, 2009

(65) Prior Publication Data

US 2010/0165580 A1      Jul. 1, 2010

(30) Foreign Application Priority Data

Dec. 25, 2008  (CN)  .................. 2008 1 0306517

(51) Int. Cl.
*H05K 7/20* (2006.01)
*F28F 7/00* (2006.01)
*H01L 23/34* (2006.01)

(52) U.S. Cl. ............ 361/719; 165/80.2; 165/80.3; 165/185; 257/719; 361/704; 361/707

(58) Field of Classification Search ......... 257/718–719; 361/719
See application file for complete search history.

(56) References Cited

U.S. PATENT DOCUMENTS

| | | | |
|---|---|---|---|
| 6,307,748 B1 * | 10/2001 | Lin et al. | ..................... 361/704 |
| 6,480,387 B1 * | 11/2002 | Lee et al. | ..................... 361/704 |
| 7,215,439 B2 * | 5/2007 | Suzuki | ..................... 358/1.18 |
| 7,283,368 B2 * | 10/2007 | Wung et al. | ................. 361/719 |
| 7,342,795 B2 * | 3/2008 | Lee et al. | ..................... 361/719 |
| 7,344,345 B2 * | 3/2008 | Aukzemas | .................. 411/372 |
| 7,430,122 B2 * | 9/2008 | Li | ............... 361/719 |
| 7,606,031 B2 * | 10/2009 | Hsieh et al. | ................. 361/700 |
| 7,626,822 B2 * | 12/2009 | Ma et al. | ..................... 361/719 |
| 7,652,886 B2 * | 1/2010 | Li et al. | ..................... 361/719 |
| 7,675,753 B2 * | 3/2010 | Li et al. | ..................... 361/719 |
| 7,729,122 B2 * | 6/2010 | Wong | ..................... 361/710 |
| 2007/0217159 A1 * | 9/2007 | Long et al. | .................. 361/704 |

\* cited by examiner

*Primary Examiner*—Gregory D Thompson
(74) *Attorney, Agent, or Firm*—Frank R. Niranjan

(57) ABSTRACT

A fastener includes a connecting pole, a sleeve, an elastic element enclosing the sleeve and a baffling portion. The connecting pole includes a shaft, a head and a thread portion. The sleeve includes an engaging portion and a receiving portion extending from the engaging portion. The engaging portion encloses a top end of the shaft therein and abuts against the head. The receiving portion encloses a bottom end of the shaft and a top end of the thread portion. The receiving portion includes a plurality of spaced resilient pieces. The baffling portion screws onto the thread portion of the connecting pole. When the connecting pole rotates relative to the sleeve, the baffling portion moves upwardly along the thread portion to push the pieces of the receiving portion outwardly to make the pieces abut against a bottom surface of a printed circuit board.

14 Claims, 5 Drawing Sheets

FASTENER AND HEAT SINK ASSEMBLY HAVING THE SAME

BACKGROUND OF THE INVENTION

1. Field of the Invention

The present invention relates to fasteners and, particularly, to a fastener capable of being conveniently assembled to and disassembled from a heat sink, and a heat sink assembly including such a heat sink and a fastener.

2. Description of Related Art

A heat sink is usually placed in thermal contact with a heat generating electronic device such as a central processing unit (CPU), and transfers heat through conduction away from the heat generating electronic device so as to prevent over-heating of the heat generating electronic device.

Conventionally, a linear-type clip is used to secure the heat sink to the heat generating electronic device by fastening the clip to a printed circuit board on which the heat generating device is mounted. The linear-type clip, which is integrally made from a resilient metal wire, generally includes an elongated pressing portion and a pair of locking arms extending from opposite ends of the elongated pressing portion in opposite directions. When assembled, the elongated pressing portion of the clip abuts against a base of the heat sink toward the heat generating device, and the locking arms are resiliently engage with clasps provided on the printed circuit board to thereby secure the heat sink to the heat generating electronic device.

In operation, due to having the resilient linear-type structure, the clip often only provides a very limited contacting area for a user to apply a force on the clip. Therefore, a larger force may be applied on the clip to firmly secure the clip to the printed circuit board. However, it is very inconvenient for a user to apply a force on the very limited contacting area of the clip. Accordingly, the assembly efficiency thereof is low.

What is needed, therefore, is a fastener of being conveniently assembled to and disassembled from a heat sink, and a heat sink assembly including such a heat sink and a fastener, thereby overcoming the above-described problems.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
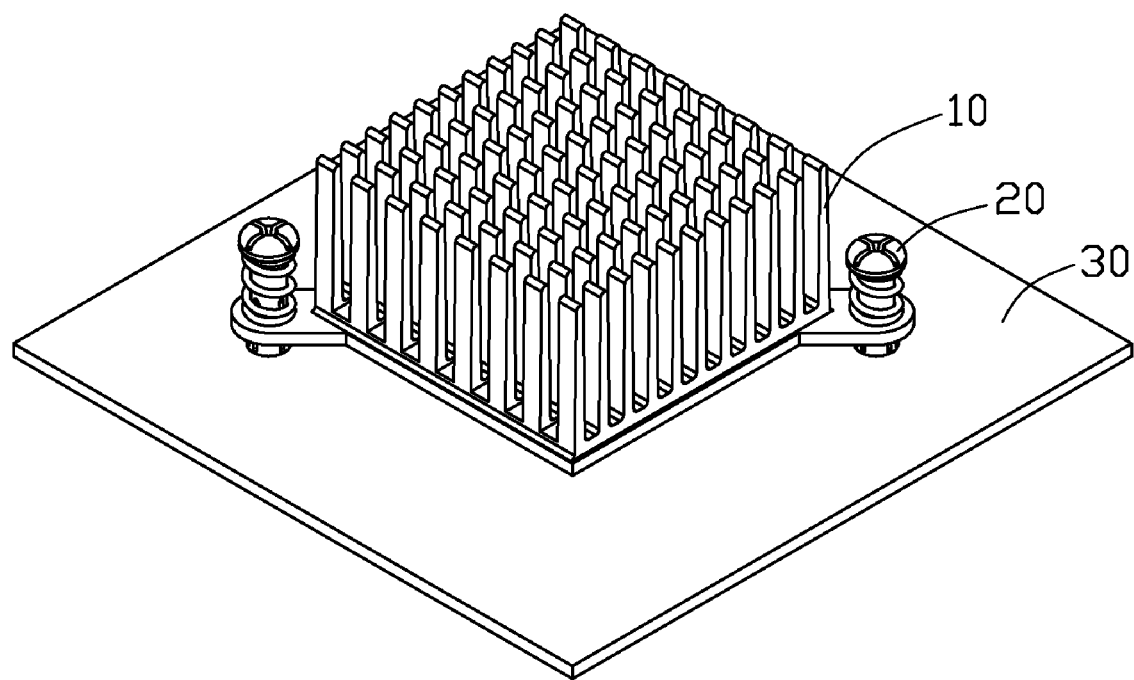
FIG. 1 is an assembled view of a heat sink assembly with a printed circuit board in accordance with an embodiment of the invention.
Figure 2:
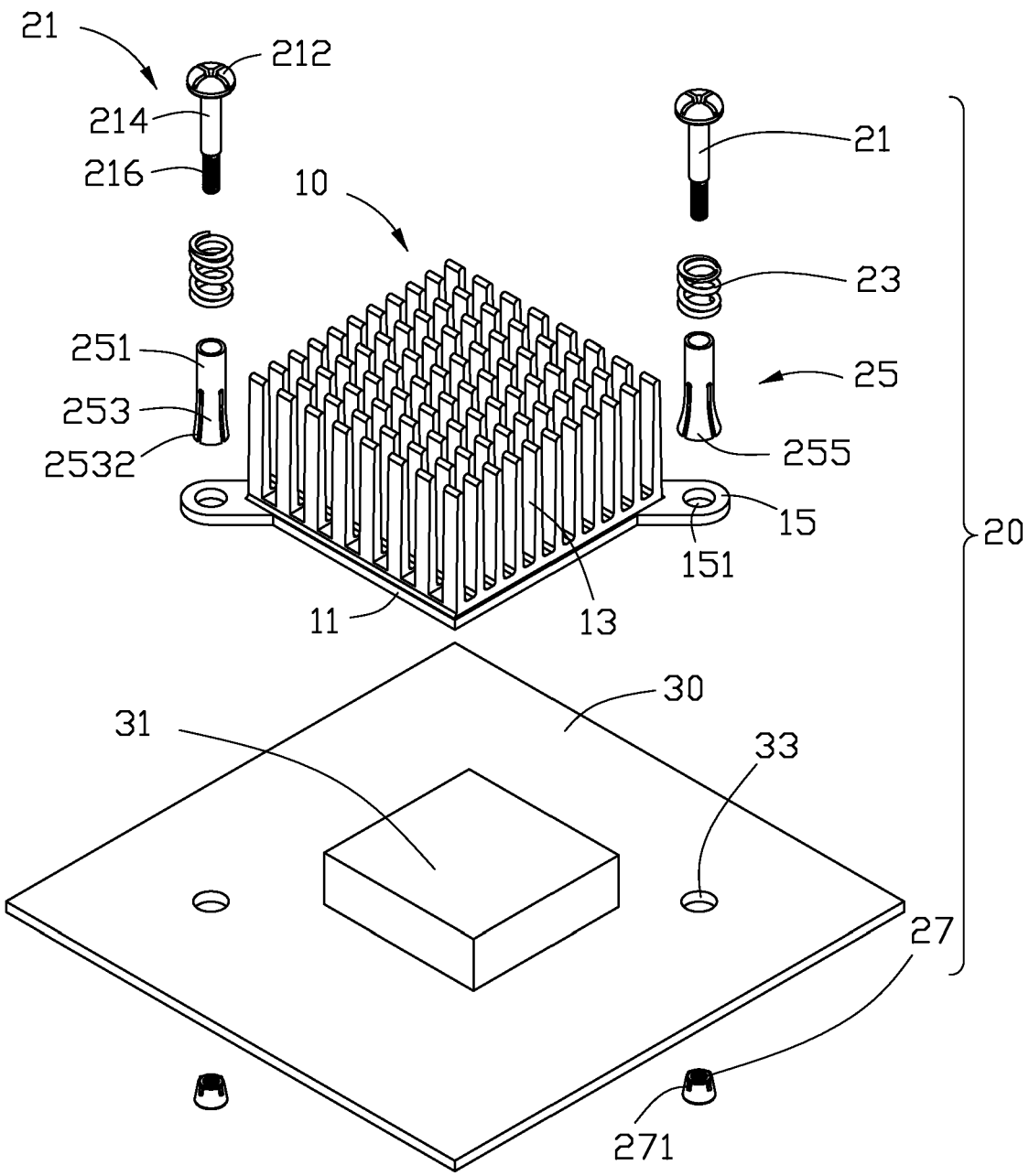
FIG. 2 is an exploded view of FIG. 1.

Referring to FIGS. 1-2, an embodiment of a heat sink assembly is mounted on a printed circuit board (PCB) 30 to dissipate heat generated by an electronic component 31 on the PCB 30. The heat sink assembly comprises a heat sink 10 and two fasteners 20 connecting the heat sink 10 with the PCB 30. The PCB 30 defines two through holes 33 near two diagonally opposite corners of the electronic component 31.

The heat sink 10 comprises an elongated base 11 and a number of fins 13 extending upwardly from a top surface of the base 11. Two ears 15 extend from two diagonally opposite corners of the base 21, respectively. Each ear 15 defines a mounting hole 151 corresponding to the through hole 33 of the PCB 30. A bore diameter of each of the mounting holes 151 is equal to that of each of the through holes 33 of the PCB 30.

Each of the fasteners 20 comprises a sleeve 25, a connecting pole 21 extending through the sleeve 25, an elastic element 23 positioned around the sleeve 25, and a baffling portion 27 engaging with the connecting pole 21. In this embodiment, the connecting pole 21 is a bolt, the elastic element 23 is a helical spring, and the baffling portion 27 is a nut. The elastic element 23 can be compressed along an axial thereof.

The connecting pole 21 is an integral structure and comprises a cylindrical shaft 214, a cap-shaped head 212 and a thread portion 216. The head 212 is located on a top end of the shaft 214. The thread portion 216 is formed at a bottom portion of the shaft 214. A diameter of the shaft 214 is smaller than that of the head 212 and larger than that of the thread portion 216. The head 212 has a cross-shaped recess (not labeled) in its top face for receiving a tool, for example, a screwdriver, to manipulate the connecting pole 21. The baffling portion 27 is for engaging with the thread portion 216.

The sleeve 25 comprises a cylinder-shaped engaging portion 251 and a receiving portion 253 extending from a bottom end of the engaging portion 251. A bore diameter of the engaging portion 251 equals to the diameter of the shaft 214 of the connecting pole 21. A bore diameter of the receiving portion 253 gradually increases from top to bottom. A plurality of slots 2532 is defined in the receiving portion 253. Each slot 2532 extends from a bottom edge of the receiving portion 253 to the engaging portion 251 so that the receiving portion 253 is divided into a plurality of resilient pieces 255. Top ends of the pieces 255 connect with the engaging portion 251 and bottom ends of the pieces 255 are spaced from each other. A width of each of the pieces 255 gradually increases from top to bottom.

Each of the baffling portions 27 is a hollow frustum. An outer diameter of a top end of the baffling portion 27 is smaller than that of a bottom end. A number of threads are formed at an inner sidewall of the baffling portion 27 to engage with the thread portion 216 of the connecting pole 21 of the fastener 20. A plurality of spaced ridges 271 corresponding to the slots 2532 of the sleeve 25 is formed at a top end of an outer sidewall of the baffling portion 27. The ridges 271 radiate downwardly and outwardly relative to an axis of the baffling portion 27 and are equidistantly spaced from each other.

Figure 3:
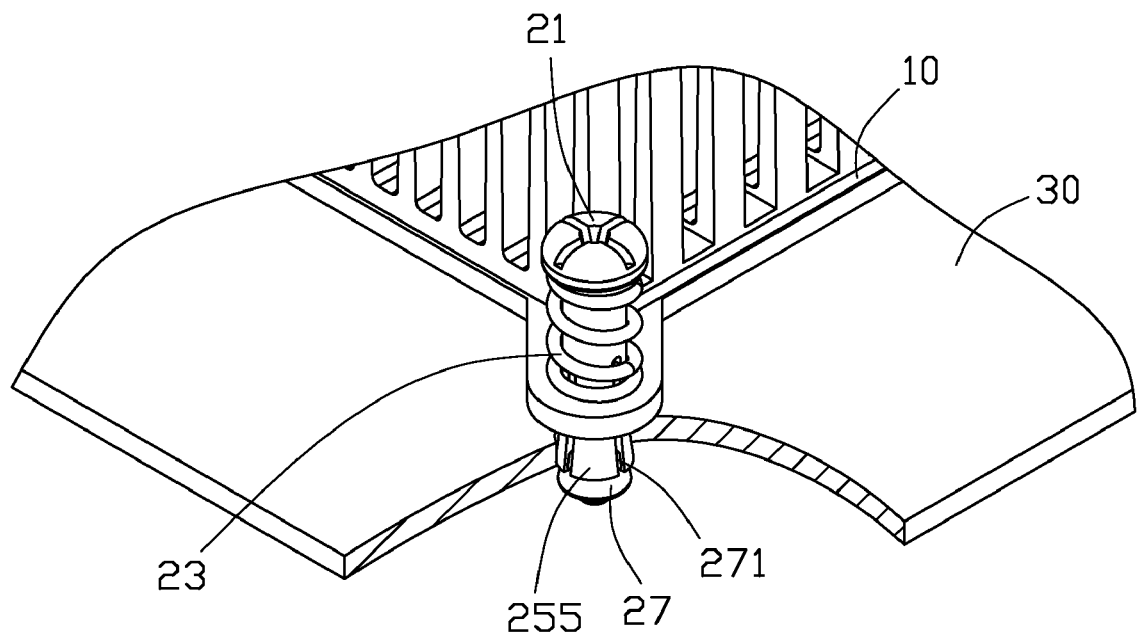
FIG. 3 is a partially cross-section view of FIG. 1, wherein a fastener of the heat sink assembly is pre-assembled.
Figure 4:
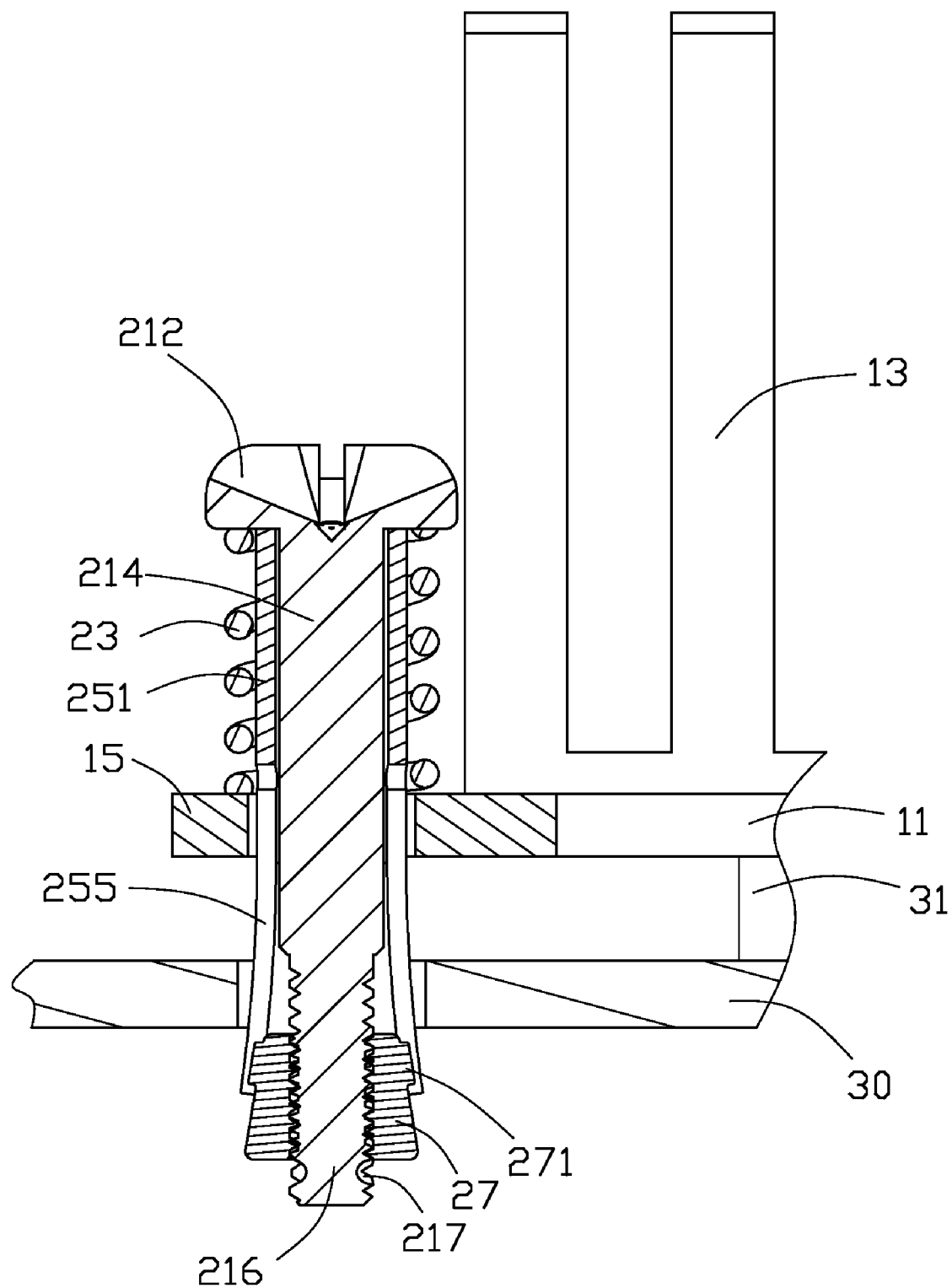
FIG. 4 is a partially cross-section view of FIG. 1, wherein the fastener is unlocked.
Figure 5:
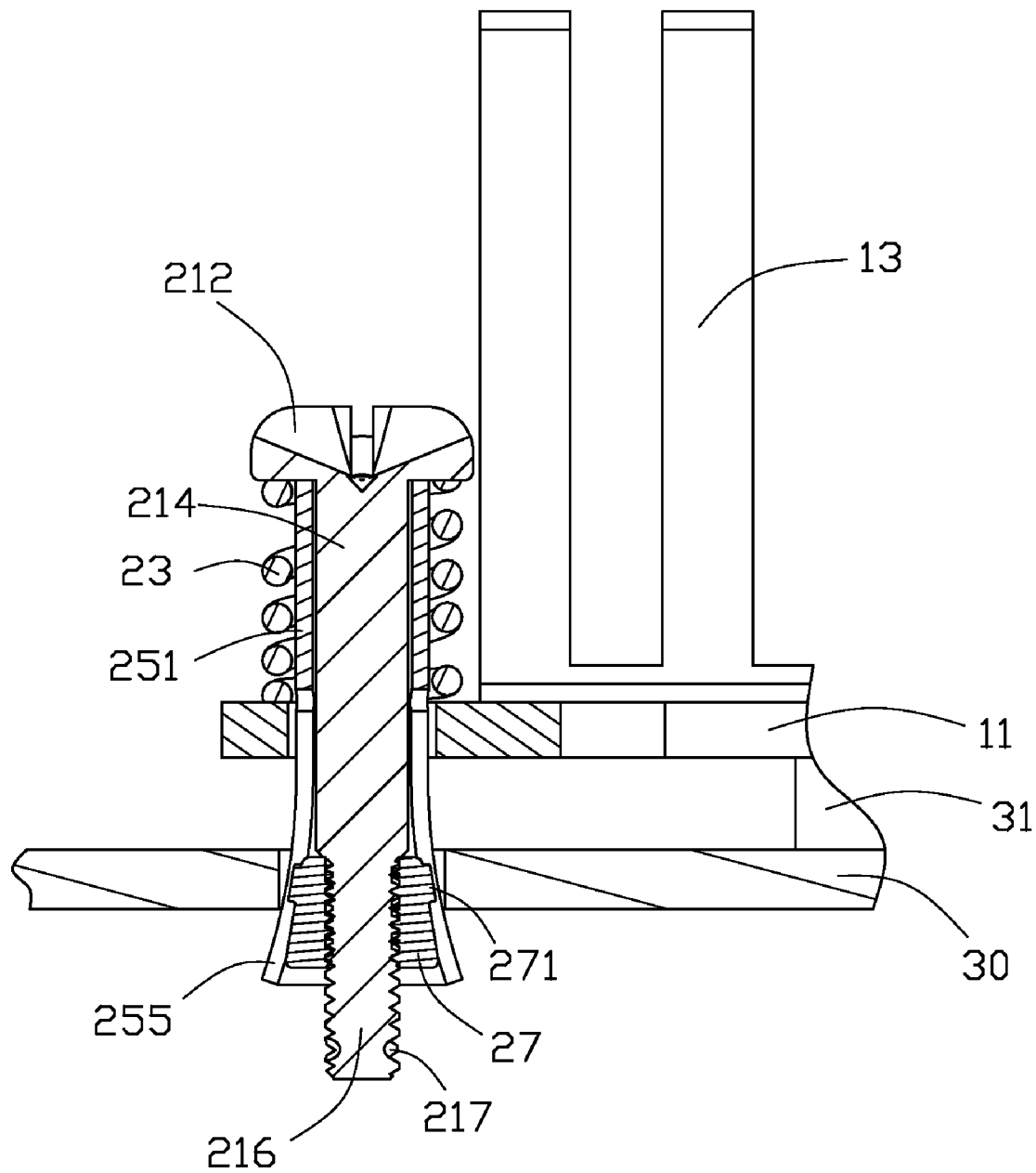
FIG. 5 is a partially cross-section view of FIG. 1, wherein the fastener is locked.

Referring to FIGS. 3-5, in assembly, the fastener 20 is pre-assembled first. The connecting pole 21 is inserted into the sleeve 25. In this state, a top end of the sleeve 25 abuts against a bottom surface of the head 212; the shaft 214 is enclosed by the engaging portion 251 of the sleeve 25; a bottom end of the thread portion 216 of the connecting pole 21 is located outside of the sleeve 25. The baffling portion 27 screws onto the bottom end of the thread portion 216 of the connecting pole 21 and the elastic element 23 is disposed around a periphery of the engaging portion 251 of the sleeve 25. In this state, each of the ridges 271 of the baffling portion 27 aims at a corresponding slot 2532 of the sleeve 25. An indent 217 is punched in the bottom-most end of the thread portion 216 of the connecting pole 21 to destroy the threads thereabout to thereby prevent the baffling portion 27 from disassembling from the thread portion 216. In this state, the fastener 20 is pre-assembled.

A bottom end of the fastener 20 extends through the mounting hole 151 of the heat sink 10 and the through hole 33 of the PCB 30 in series. In this state, the elastic element 23 is sandwiched between the bottom surface of the head 212 of the connecting pole 21 and a top surface of the ear 15 of the heat sink 10; the receiving portion 253 of the sleeve 25 is beyond a bottom surface of the PCB 30.

The head 212 of the connecting pole 21 is pressed downwardly and rotating along an anti-clockwise direction. Thus, the sleeve 25 and the connecting pole 21 move downwards relative to the base 11 of the heat sink 10 and the baffling portion 27 moves upwards along a longitudinal direction of the thread portion 216 of the connecting pole 21 relative to the base 11 of the heat sink 10. In this process, the elastic element 23 is compressed to press the ear 15 of the heat sink 10; the ridges 271 of the baffling portion 27 moves upwards along a longitudinal direction the slots 2532 of the sleeve 25; the baffling portion 27 pushes the pieces 255 of the receiving portion 253 of the sleeve 25 to make them move outwards. When the baffling portion 27 travels a distance along the thread portion 216, the bore diameter of a bottom end of the receiving portion 253 becomes larger than the bore diameter of the through hole 33 of the PCB 30 and the pieces 255 firmly abut against the bottom surface of the PCB 30 surrounding the through hole 33. Therefore, the heat sink 10 is firmly mounted on the PCB 30. In addition, in such process of turning the connecting pole 21, the ridges 271 engaging in the slots 2532 can prevent the sleeve 25 from rotating relative to the connecting pole 21. To disassemble the heat sink 10 from the electronic component 31, the connecting poles 21 are rotated along an opposite direction, i.e. clockwise direction, thereby to lower the baffle portion 27 along the threaded portion 216 a sufficient distance in which the resilient pieces 255 no longer abut against the bottom surface of the printed circuit board 30.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A fastener adapted for assembling a heat sink and a printed circuit board together comprising:
   a connecting pole comprising a shaft, a head and a thread portion, the head and the thread portion being at opposite ends of the shaft, respectively;
   a sleeve receiving the connecting pole therein, the sleeve comprising an engaging portion and a receiving portion extending from an end of the engaging portion, the engaging portion enclosing a top end of the shaft of the connecting pole therein and abutting against the head of the connecting pole, the receiving portion enclosing a bottom end of the shaft and a top end of the thread portion of the connecting pole therein, the receiving portion comprising a plurality of spaced resilient pieces;
   an elastic element enclosing a periphery of the engaging portion of the sleeve; and
   a baffling portion screwing onto the thread portion of the connecting pole;
   wherein when the connecting pole rotates relative to the sleeve, the baffling portion moves upwardly along a longitudinal direction of the thread portion of the connecting pole to enter the receiving portion of the sleeve and push the pieces of the receiving portion to make the pieces move outwards.

2. The fastener as claimed in claim 1, wherein a bore diameter of the receiving portion of the sleeve gradually increases from an end connecting the engaging portion to another end away from the engaging portion.

3. The fastener as claimed in claim 1, wherein a width of each of the pieces of the receiving portion of the sleeve gradually increases from an end connecting the engaging portion to another end away from the engaging portion.

4. The fastener as claimed in claim 1, wherein the shaft, the head and the thread portion of the connecting pole are coaxial.

5. The fastener as claimed in claim 1, wherein a plurality of spaced ridges is formed on a periphery of the baffling portion and extends into gaps between the pieces of the sleeve, respectively.

6. The fastener as claimed in claim 5, wherein the baffling portion is a hollow frustum, an outer diameter of a top end thereof is smaller than that of a bottom end and a bore diameter of a bottom portion of the receiving portion.

7. The fastener as claimed in claim 5, wherein the ridges radiate downwardly and outwardly relative to an axis of the baffling portion and are equidistantly spaced from each other.

8. The fastener as claimed in claim 5, wherein a bottom end of the thread portion of the connecting pole defines a indent.

9. A heat sink assembly adapted to dissipate heat generated by an electronic component mounted on a top surface of a printed circuit board (PCB), the printed circuit board defining a through hole beside the electronic, the heat sink assembly comprising:
   a heat sink defining a mounting hole corresponding to the through hole of the PCB; and
   a fastener extending through the mounting hole of the heat sink and the through hole of the PCB in series to assemble the heat sink to the PCB, the fastener comprising:
   a connecting pole comprising a shaft, a head and a thread portion located at opposite ends of the shaft, respectively;
   a sleeve receiving the connecting pole therein, the sleeve comprising an engaging portion and a receiving portion extending from an end of the engaging portion, the engaging portion enclosing a top end of the shaft of the connecting pole therein and abutting against the head of the connecting pole, the receiving portion enclosing a bottom end of the shaft and a top end of the thread portion of the connecting pole therein, the receiving portion comprising a plurality of spaced resilient pieces;
   an elastic element enclosing a periphery of the engaging portion of the sleeve and compressed between the head of the connecting pole and the heat sink; and
   a baffling portion screwing onto the thread portion of the connecting pole;
   wherein when the connecting pole is rotated relative to the sleeve, the baffling portion moves upwardly along a longitudinal direction of the thread portion of the connecting pole to enter the receiving portion of the sleeve and push the pieces of the receiving portion to make the pieces move outwardly to abut against a bottom surface of the PCB.

10. The heat sink assembly as claimed in claim 9, wherein a bore diameter of the receiving portion of the sleeve is decreased from an end connecting the engaging portion to another end away from the engaging portion.

11. The heat sink assembly as claimed in claim 9, wherein the shaft, the head and the thread portion of the connecting pole are coaxial.

12. The heat sink assembly as claimed in claim 9, wherein a plurality of spaced ridges is formed on a periphery of a baffling portion and extends into gaps between the pieces of the sleeve; respectively.

13. The heat sink assembly as claimed in claim 12, wherein the baffling portion is a hollow frustum, an outer diameter of a top end thereof is smaller than that of a bottom end and a bore diameter of a bottom portion of the receiving portion.

14. The heat sink assembly as claimed in claim 12, wherein the ridges radiate downwardly and outwardly relative to an axis of the baffling portion and are equidistantly spaced from each other.

* * * * *